United States Patent
Sakamoto et al.

(10) Patent No.: US 8,076,843 B2
(45) Date of Patent: Dec. 13, 2011

(54) ORGANIC ELECTROLUMINESCENCE DISPLAY DEVICE

(75) Inventors: Hirotsugu Sakamoto, Chiba (JP); Hiroshi Oooka, Mobara (JP); Takeshi Ookawara, Mobara (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 609 days.

(21) Appl. No.: 11/697,332

(22) Filed: Apr. 6, 2007

(65) Prior Publication Data
US 2007/0241672 A1 Oct. 18, 2007

(30) Foreign Application Priority Data
Apr. 14, 2006 (JP) .................................. 2006-111473

(51) Int. Cl.
*H01L 51/52* (2006.01)
*G09G 3/12* (2006.01)
(52) U.S. Cl. ..................................... 313/506; 315/169.3
(58) Field of Classification Search .................. 313/504, 313/505; 315/169.3; 345/76
See application file for complete search history.

(56) References Cited

U.S. PATENT DOCUMENTS
| | | | |
|---|---|---|---|
| 2003/0146693 A1* | 8/2003 | Ishihara et al. | 313/504 |
| 2003/0214231 A1* | 11/2003 | Hishida | 313/506 |
| 2004/0140465 A1* | 7/2004 | Kimura | 257/40 |
| 2005/0127824 A1* | 6/2005 | Mori et al. | 313/504 |
| 2005/0236981 A1* | 10/2005 | Cok et al. | 313/504 |

FOREIGN PATENT DOCUMENTS
JP 2003-122301 4/2003

OTHER PUBLICATIONS
Dictionary.com, Definition of "On."*

* cited by examiner

*Primary Examiner* — Nimeshkumar Patel
*Assistant Examiner* — Steven Horikoshi
(74) *Attorney, Agent, or Firm* — Antonelli, Terry, Stout & Kraus, LLP.

(57) ABSTRACT

An organic electroluminescence display device wherein the wiring width is made large enough to secure a current capacity for the power supply line and at the same time high luminance is achieved by increasing the aperture rate is to be realized. The device has lower electrodes formed over the main face of a transparent substrate, a plurality of organic electroluminescence elements each stacked over one or another of the lower electrodes and emitting light of a prescribed color, and an upper electrode formed as a film covering the plurality of organic electroluminescence layers in common, and this upper electrode is reflective and the luminescence from the organic electroluminescence elements is emitted from the transparent substrate side. The device further has: a pixel circuit including, over the inner face of the transparent substrate, a plurality of signal lines and a plurality of scanning lines arranged crossing each other and an organic electroluminescence layer in each of pixel areas surrounded by the signal lines and the scanning lines; and a power supply line for supplying a current to the organic electroluminescence layer, wherein the pixel line is arranged across the pixel areas.

3 Claims, 4 Drawing Sheets

ORGANIC ELECTROLUMINESCENCE DISPLAY DEVICE

CLAIM OF PRIORITY

The present application claims priority from Japanese Application JP 2006-111473 filed on Apr. 14, 2006, the content of which is hereby incorporated by reference into this application.

BACKGROUND OF THE INVENTION (1) Field of the Invention

The present invention relates to an organic electroluminescence (EL) display device, and more particularly to an organic EL display device suitable for expanding the pixel area to obtain enhanced luminance.

(2) Description of the Related Art

Flat panel type display devices already in practical use or under research for commercialization include liquid crystal displays (LCD), plasma display panels (PDP), field emission displays (FED) and organic EL displays (OLED). Of these display devices, organic EL displays are very promising display devices as typical thin, light-weight self light-emitting display devices. There are two different types of organic EL display devices, including the so-called bottom emission type and top emission type. The present invention is applied to organic EL display devices of the bottom emission type.

A bottom emission type organic EL display device is formed of multiple organic EL light emitting layers (organic EL elements), each of which emits light in a prescribed color, stacked over one (lower electrode) of transparent electrodes formed for each pixel over the inner face of a transparent substrate, such as a glass substrate, and the other electrode (upper electrode) formed over that lower electrode. By applying a voltage between the lower electrode and the upper electrode to inject holes and carriers into the organic EL light emitting layers, lights of prescribed frequencies (color lights) are emitted. By arranging a plurality of such pixels two-dimensionally (in a matrix), an image is displayed. Such a display device is disclosed in Japanese Patent Application Laid-Open Publication No. 2003-122301 for instance. Japanese Patent Application Laid-Open Publication No. 2003-122301 describes an organic EL display device which is provided with a capability to display satisfactory moving pictures by controlling the luminescence per frame of the image with display data.

SUMMARY OF THE INVENTION

FIGS. 6A and 6B illustrate examples of configuration in the vicinity of one pixel of a conventional organic EL display device of the bottom emission type. FIG. 6A shows a plan and FIG. 6B, a sectional view along line X-X' in FIG. 6A. The light emitting area PX of the one pixel is formed in a region surrounded by signal lines (data lines) DL(m) and DL(m+1) and scanning lines GL(n) and GL(n+1). Further, there are provided power supply lines (current supply lines to the organic EL elements) PL(m) and PL(m+1) in parallel with the signal lines (data lines) DL(m) and DL(m+1) and outside the light emitting area PX.

The signal lines, scanning lines and power supply lines are formed over the main face (inner face) of a transparent substrate SUB, which preferably should be made of glass, and a lower electrode BEL is formed over it for each pixel via a passivation film PAS. This organic EL display device has banks BNK composed of insulating films formed on both sides of the light emitting area PX as shown in FIG. 6B. Thus, inner edges BNK-A of the banks BNK constitute an aperture area defining the light emitting area PX.

An organic EL element is composed of multiple organic EL light emitting layers ILL stacked over the upper layer of the transparent lower electrode BEL and an upper electrode UEL formed in common for a plurality of pixels. The upper electrode UEL is formed of a reflective metal, preferably chromium-molybdenum (Cr—Mo) or molybdenum-tungsten (Mo—W). The lower electrode BEL is formed of a transparent electroconductive film of indium tin oxide (ITO) or indium zinc oxide (IZO). The suitable material for the signal lines, scanning lines and power supply lines is aluminum.

This pixel is selected by the scanning line GL(n+1). Display data supplied from the signal line DL(m) are accumulated in a capacitance Cstg through a first thin film transistor (switching transistor) TFT1. A second thin film transistor (drive transistor) TFT2 becomes conductive at the display timing, and supplies a current matching the magnitude of the display data accumulated in the capacitance Cstg to the lower electrode BEL by way of the power supply line PL(m). On the way of the flow of the current from the lower electrode BEL to the upper electrode UEL through the organic EL light emitting layers ILL, neutralization occurring between holes and electrons within the organic EL light emitting layers ILL generates light emission. This generated light is emitted from the light emitting area PX to outside the transparent substrate SUB.

The size of the light emitting area PX, namely the aperture rate of pixels, is determined by the width of the banks BNK. As the configurations shown in FIGS. 6A and 6B are formed covering the signal line DL(m) and the power supply line PL(m), its width is so expanded that the inner edges BNK-A of the bank BNK significantly bulge out into the light emitting area PX. The width of these banks BNK can be narrowed by reducing the wiring widths of the signal lines DL(m) and the power supply line PL(m) or the spacing between the two sets of wiring. However, the narrowing of the wiring widths or the spacing has its own limit, and a prescribed width has to be secured for the power supply line PL(m) in particular because a large current has to flow through the line. Incidentally, though there are organic EL display devices having no such banks, even these device also have an insulating layer defining the light emitting area PX in a configuration covering the signal line and the power supply line, and accordingly are subject to the same problem.

An object of the present invention is to provide an organic EL display device wherein the wiring width is large enough to secure a sufficient current capacity for the power supply line and at the same time high luminance is achieved by increasing the aperture rate.

An organic EL display device according to the invention is a bottom emission type organic EL display device which has over the inner face of a transparent substrate a lower electrode formed for each pixel, a plurality of organic EL elements each stacked over one or another of the lower electrodes and emitting light of a prescribed color, and an upper electrode formed as a film covering the plurality of organic EL layers in common, wherein this upper electrode is reflective and the luminescence from the organic EL elements is emitted from the transparent substrate side.

The organic EL display device is provided over the inner face of the transparent substrate with a plurality of signal lines and a plurality of scanning lines arranged crossing each other and an organic EL element in each of pixel areas surrounded by the signal lines and the scanning lines, and a power supply line for supplying a current to the organic EL element, wherein the power supply line is arranged crossing the pixel areas.

The organic EL display device may also have a pixel circuit provided over the inner face of a transparent substrate with a plurality of signal lines and a plurality of scanning lines arranged crossing each other and an organic EL element in each of pixel areas surrounded by the signal lines and the scanning lines, and a power supply line for supplying a current to the organic EL element, wherein the pixel areas are defined by an aperture partitioned by banks formed covering the signal lines, and the luminescence from the organic EL element is emitted from the transparent substrate side. The power supply line can be arranged crossing the pixel areas.

The invention also provides a configuration in which the power supply line is arranged underneath the organic EL element, namely on the transparent substrate side, and the organic EL element swells in a ridge shape within the pixel area.

The arrangement of the power supply line across the pixel area makes the wiring width large enough to secure a sufficient current capacity for the power supply line, and at the same time enables high luminance to be achieved by increasing the aperture ratio.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENT

A preferred embodiment of the present invention will be described in detail below with reference to the accompanying drawings thereof.

Embodiment 1

Figure 1:
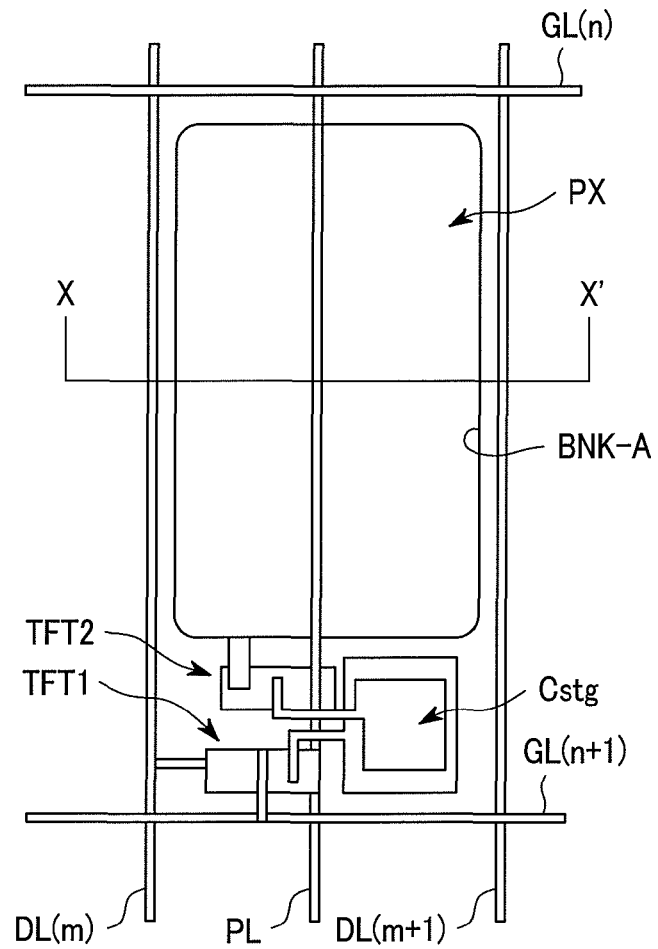
FIG. 1 is a plan illustrating an example of configuration in the vicinity of one pixel of a bottom emission type organic EL display device, which is Embodiment 1 of the present invention.
Figure 2:
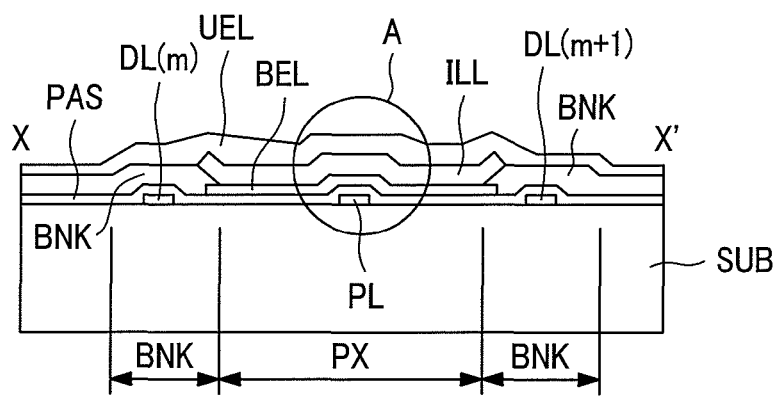
FIG. 2 is a sectional view along line X-X' in FIG. 1.

FIG. 1 is a plan illustrating an example of configuration in the vicinity of one pixel of a bottom emission type organic EL display device, which is Embodiment 1 of the invention. FIG. 2 is a sectional view along line X-X' in FIG. 1. The light emitting area PX of one pixel in Embodiment 1 is formed in a region surrounded by signal lines (data lines) DL(m) and DL(m+1) and scanning lines GL(n) and GL(n+1). Further in Embodiment 1, there are provided power supply lines PL, which are (current supply lines to the organic EL elements in parallel with the signal lines (data lines) DL(m) and DL(m+1) and across the light emitting area PX.

Thus, the signal lines DL(m) and DL(m+1), the scanning lines GL(n) and GL(n+1) and the power supply lines PL are formed over the main face (inner face) of a transparent substrate SUB, which preferably should be made of glass. A lower electrode BEL is formed over it for each pixel via a passivation film PAS. This organic EL display device has banks BNK composed of insulating films formed on both sides of the light emitting area PX as shown in FIG. 2. Thus, inner edges BNK-A of the banks BNK constitute an aperture area defining the light emitting area PX.

An organic EL element is composed of multiple organic EL light emitting layers ILL stacked over the upper layer of the transparent lower electrode BEL and an upper electrode UEL formed in common for a plurality of pixels. The upper electrode UEL is formed of a reflective metal, preferably chromium-molybdenum (Cr—Mo) or molybdenum-tungsten (Mo—W). The lower electrode BEL is formed of a transparent electroconductive film of indium tin oxide (ITO) or indium zinc oxide (IZO). The suitable material for the signal lines, scanning lines and power supply lines is aluminum, but some other transparent conductor may be used as well.

This pixel is selected by the scanning line GL(n+1). Display data supplied from the signal line DL(m) are accumulated in a capacitance Cstg through a first thin film transistor (switching transistor) TFT1. Continuity of a second thin film transistor (drive transistor) TFT2 established at the display timing causes a current matching the magnitude of the display data accumulated in the capacitance Cstg to be supplied to the lower electrode BEL by way of the power supply line PL. On the way of the flow of the current from the lower electrode BEL to the upper electrode UEL through the organic EL light emitting layers ILL, neutralization occurring between holes and electrons within the organic EL light emitting layers ILL generates light emission. This generated light is emitted from the light emitting area PX to outside the transparent substrate SUB.

The arrangement of the power supply line PL in the light emitting area PX as shown in the part surrounded by circle A in FIG. 2 results in a configuration in which the power supply line PL part of the organic EL element consisting of the lower electrode BEL, the organic EL light emitting layer ILL and the upper electrode UEL swells in a ridge shape along the power supply line PL.

Figure 3:
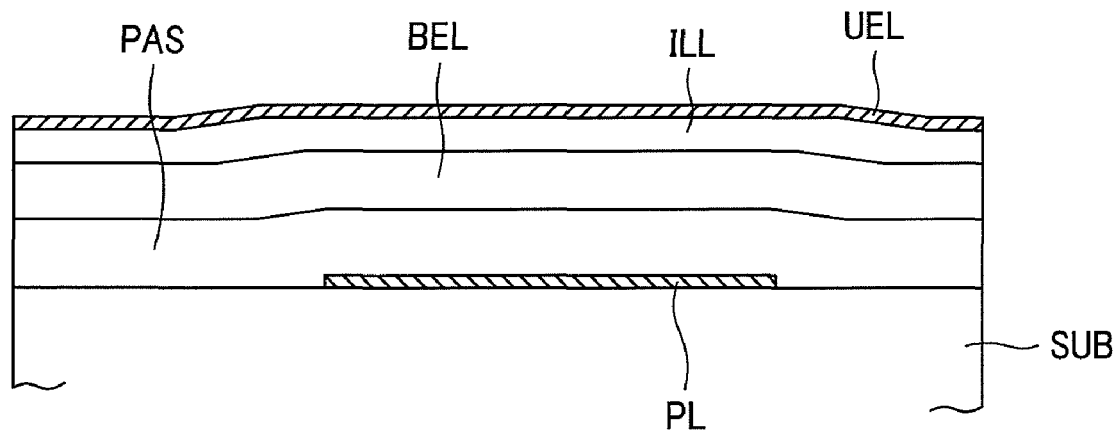
FIG. 3 is a schematic enlarged view showing the part surrounded by circle A in FIG. 2.
Figure 4:
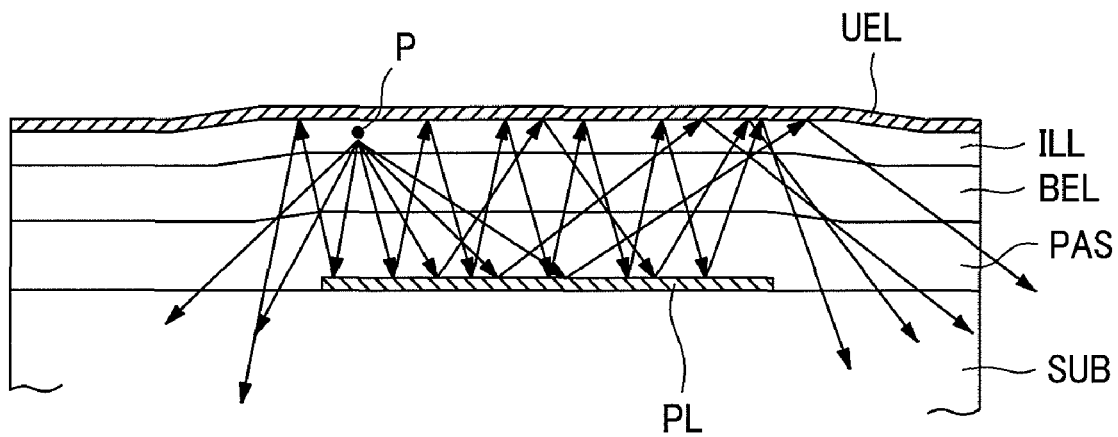
FIG. 4 is a schematic enlarged view illustrating the light emission path when the organic EL element has emitted light in the part shown in FIG. 3.

FIG. 3 is a schematic enlarged view showing the part surrounded by circle A in FIG. 2. FIG. 4 is a schematic enlarged view illustrating the light emission path when the organic EL element has emitted light in the part shown in FIG. 3. In the part surrounded by circle A in FIG. 2, the power supply line PL is positioned on the emitting side of the light from the organic EL light emitting layer ILL. This arrangement may give an impression that the light emission from the organic EL light emitting layer ILL in the part positioned above the power supply line PL is obstructed by the power supply line PL, which is metallic wiring, resulting in a decreased aperture ratio and consequently a drop in luminance. However, as indicated by arrows in FIG. 4, the light generated at point P, for instance, repeats reflection between the power supply line PL and the upper electrode UEL and is emitted from the transparent substrate SUB. Therefore, even though the power supply line PL is positioned within the light emitting area PX, the multiple reflections between the power supply line PL, which is metallic wiring, and the upper electrode UEL make the emitted light an effective display light, but invite no drop in luminance.

Embodiment 1 makes it possible to realize an organic EL display device in which a great enough wiring width for the power supply line to secure a sufficient current capacity is achieved and at the same time high luminance is realized by increasing the aperture rate.

Figure 5A:
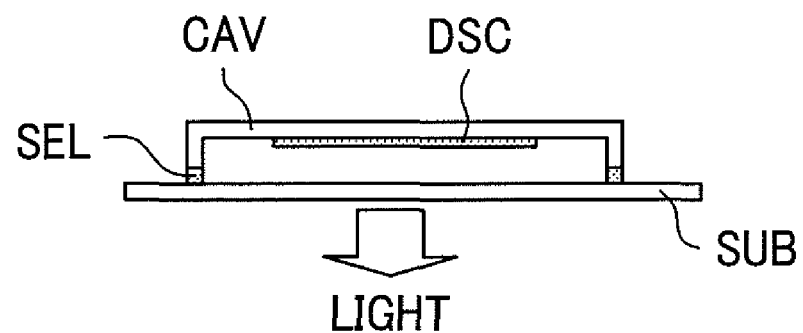
FIGS. 5A and 5B illustrate examples of configuration of a bottom emission type organic EL display device to which the invention is applied.
Figure 5B:
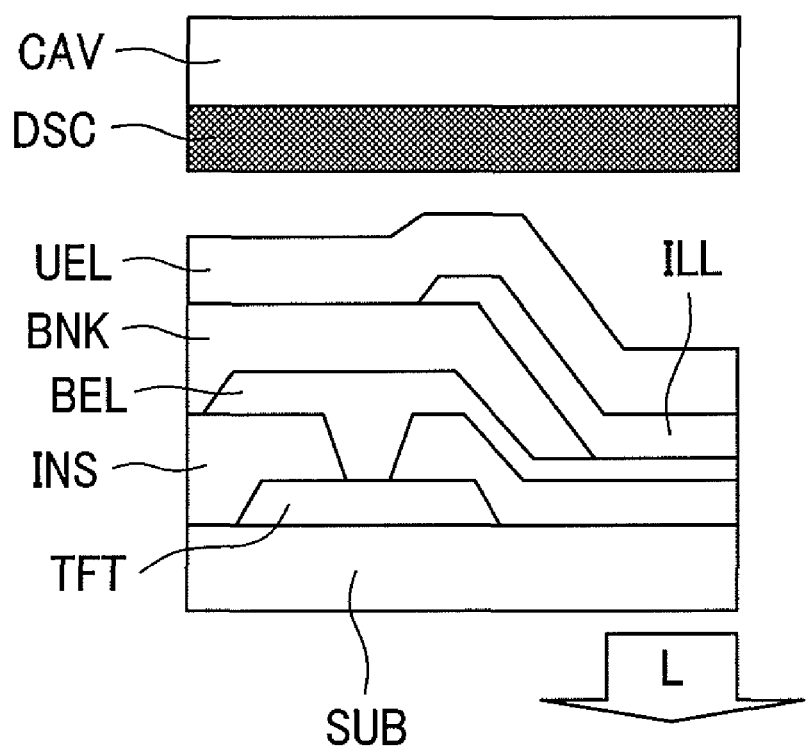
Figure 6A:
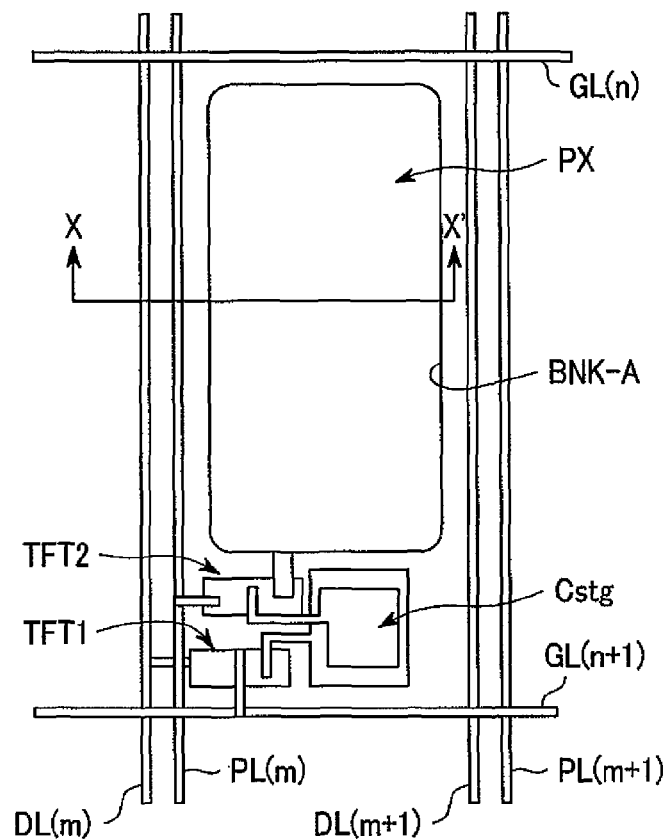
FIGS. 6A and 6B illustrate examples of configuration in the vicinity of one pixel of a conventional organic EL display device of the bottom emission type.
Figure 6B:
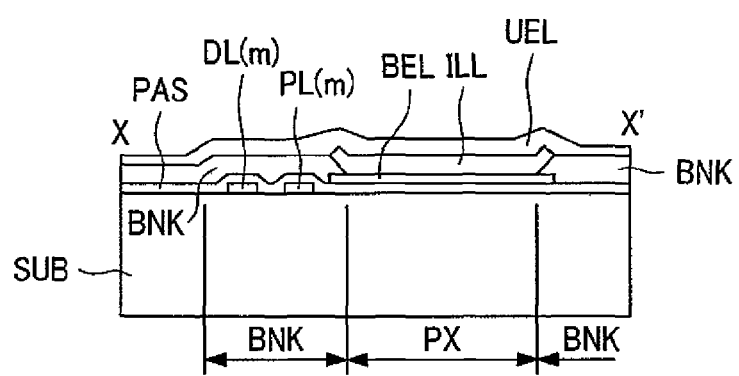

FIGS. 5A and 5B illustrate examples of configuration of a bottom emission type organic EL display device to which the invention is applied. FIG. 5A is a sectional view schematically illustrating the overall configuration and FIG. 5B, a sectional view illustrating an example of configuration of a unit pixel. The bottom emission type organic EL display device has a thin film transistor TFT over the main face of the transparent substrate SUB, which preferably should be made of glass, and lower electrodes BEL are formed through contact holes bored in an insulating film INS including a pass film. One lower electrode BEL is formed for each unit pixel.

There are banks BNK formed of an insulator above the area in which the thin film transistor TFT is formed, and they make up an accommodating part for an organic EL light emitting layer ILL, which serves as partitioning between adjacent unit pixels and emits light when an electric field is applied to it. The reflective upper electrode UEL is formed covering the organic EL light emitting layer ILL. The transparent substrate SUB having over its main face the organic EL element configured in this way is isolated from the external atmosphere by a sealing can CAV, and sealed with a sealing material SEL, such as an adhesive. Incidentally, within the interior sealed by the sealing can CAV, a drying agent or a hygroscopic agent DSC is held.

By using the lower electrode BEL as the anode and the upper electrode UEL as the cathode for instance and applying an electric field between them, carriers (electrons and positive holes) are injected into the organic EL element to cause light to be generated. The luminescence L from the organic EL element is emitted outside through the transparent substrate SUB. The unit pixels of this organic EL element are color pixels of red (R), green (G) and blue (B), and full color image displaying is achieved by arranging these color pixels in a plurality of arrays in a matrix form.

Incidentally, though the power supply line PL is supposed to be arranged in parallel with the signal line DL in the light emitting area PX in the embodiment described above, the arrangement is not limited to this, but the power supply line PL can as well be arranged in parallel, or not in parallel, with the scanning line GL linearly or nonlinearly in a desired shape. Also, by arranging a plurality of power supply lines PL for each pixel, the current capacitance can be increased.

What is claimed is:

1. An organic electroluminescence display device, comprising:
  a pixel circuit having, over an upper surface of a transparent substrate, a plurality of signal lines and a plurality of scanning lines arranged crossing each other and an organic electroluminescence element in each of pixel areas surrounded by the signal lines and the scanning lines, the pixel areas being defined by an aperture partitioned by banks formed covering the signal lines; and
  a power supply line for supplying a current to the organic electroluminescence element, and
  emitting the luminescence from the organic electroluminescence element from a lower surface of the transparent substrate;
  wherein the power supply line and the signal lines are provided above and directly on an upper surface of a same layer;
  wherein the power supply line is formed of aluminum;
  wherein the power supply line is arranged crossing the pixel areas; and
  wherein the power supply line is arranged on the transparent substrate side of the organic electroluminescence element.

2. The organic electroluminescence display device according to claim 1,
  wherein the organic electroluminescence element swells in a ridge shape within the pixel area.

3. An organic electroluminescence display device, comprising:
  a pixel circuit having, over an upper surface of a transparent substrate, a plurality of signal lines and a plurality of scanning lines arranged crossing each other and an organic electroluminescence element in each of pixel areas surrounded by the signal lines and the scanning lines, the pixel areas being defined by an aperture partitioned by banks formed covering the signal lines; and
  a power supply line for supplying a current to the organic electroluminescence element, and
  emitting the luminescence from the organic electroluminescence element from a lower surface of the transparent substrate;
  wherein the power supply line and the signal lines are provided above and directly on an upper surface of a same layer;
  wherein the power supply line is formed of aluminum;
  wherein the power supply line is present within the pixel areas; and
  wherein the organic electroluminescence element is formed of at least one upper electrode and at least one lower electrode and at least one organic film layer placed between the at least one lower electrode and the at least one upper electrode;
  wherein the at least one upper electrode is formed of metal;
  wherein the at least one lower electrode is formed as a transparent electrode; and
  wherein the power supply line is formed closer to the transparent substrate than the at least one lower electrode to the transparent substrate in the pixel areas.

* * * * *